United States Patent
Goodnow et al.

(10) Patent No.: US 7,716,615 B2
(45) Date of Patent: May 11, 2010

(54) REDUNDANT CRITICAL PATH CIRCUITS TO MEET PERFORMANCE REQUIREMENT

(75) Inventors: Kenneth J. Goodnow, Essex, VT (US); Stephen G. Shuma, Underhill, VT (US); Peter A. Twombly, Shelburne, VT (US)

(73) Assignee: International Business Machines Corporation, Armonk, NY (US)

(*) Notice: Subject to any disclaimer, the term of this patent is extended or adjusted under 35 U.S.C. 154(b) by 20 days.

(21) Appl. No.: 11/848,278

(22) Filed: Aug. 31, 2007

(65) Prior Publication Data

US 2009/0058457 A1    Mar. 5, 2009

(51) Int. Cl.
G06F 17/50    (2006.01)
(52) U.S. Cl. .................................... 716/6; 716/1; 716/5
(58) Field of Classification Search ............ 716/1, 716/5, 6
See application file for complete search history.

(56) References Cited

U.S. PATENT DOCUMENTS

| | | | | |
|---|---|---|---|---|
| 5,638,290 A * | 6/1997 | Ginetti et al. ............... | 716/2 |
| 5,872,717 A * | 2/1999 | Yu et al. ..................... | 716/6 |
| 5,953,745 A * | 9/1999 | Lattimore et al. ........... | 711/162 |
| 6,201,744 B1 * | 3/2001 | Takahashi ................... | 365/189.04 |
| 6,385,071 B1 * | 5/2002 | Chai et al. ................... | 365/49.1 |
| 6,714,902 B1 * | 3/2004 | Chao et al. .................. | 703/14 |
| 6,732,229 B1 * | 5/2004 | Leung et al. ................ | 711/109 |
| 7,093,216 B2 * | 8/2006 | Nozuyama ................... | 716/4 |
| 7,117,417 B2 | 10/2006 | Sharpe et al. | |
| 7,437,580 B2 * | 10/2008 | Henderson et al. .......... | 713/320 |
| 2004/0230928 A1 * | 11/2004 | Nozuyama ................... | 716/5 |
| 2006/0187001 A1 | 8/2006 | Pessolano et al. | |
| 2007/0006117 A1 * | 1/2007 | Chang et al. ................ | 716/21 |
| 2007/0260823 A1 | 11/2007 | Dickinson | |
| 2008/0077348 A1 * | 3/2008 | Hildebrand et al. ......... | 702/117 |
| 2009/0031261 A1 * | 1/2009 | Smith et al. ................. | 716/2 |
| 2009/0144673 A1 * | 6/2009 | Goodnow et al. ........... | 716/2 |
| 2009/0289696 A1 * | 11/2009 | Lewis et al. ................. | 327/534 |

OTHER PUBLICATIONS

U.S. Appl. No. 12/362,541, Office Action, Sep. 4, 2009, 15 pages.
U.S. Appl. No. 12/362,542, filed Jan. 30, 2009, Notice of Allowance and Fees Due dated Feb 2, 2010.

* cited by examiner

*Primary Examiner*—Paul Dinh
*Assistant Examiner*—Suchin Parihar
(74) *Attorney, Agent, or Firm*—W. Riyon Harding; Hoffman Warnick LLC

(57) ABSTRACT

Method, system, IC and design structure for meeting a performance requirement using redundant critical path circuits, are disclosed. In one embodiment, the IC includes a plurality of redundant critical path circuits, wherein at least one of the plurality of redundant critical path circuits meeting a performance requirement is operational and the others are non-operational.

7 Claims, 4 Drawing Sheets

REDUNDANT CRITICAL PATH CIRCUITS TO MEET PERFORMANCE REQUIREMENT

BACKGROUND

1. Technical Field

The disclosure relates generally to integrated circuit (IC) chip fabrication and design, and more particularly, to a method, system, IC and design structure for meeting a performance requirement using redundant critical path circuits.

2. Background Art

In the integrated circuit (IC) fabrication industry, miniaturization of circuitry continues. As this occurs, process variability has become increasingly troublesome. For example, at smaller geometries (e.g., 90 nm, 65 nm or 45 nm technology nodes) absolute errors in oxide thickness, length and other dimensions present a larger percentage of errors. Further, worst case performance is not scaling at the same rate as circuit density, and significant variation can be observed within a single IC. Currently, most IC fabricators focus on maximizing performance of a given critical path, e.g., by increasing voltage, maintaining temperature, etc.

SUMMARY

Method, system, IC and design structure for meeting a performance requirement using redundant critical path circuits, are disclosed. In one embodiment, the IC includes a plurality of redundant critical path circuits, wherein at least one of the plurality of redundant critical path circuits meeting a performance requirement is operational and the others are non-operational.

A first aspect of the disclosure provides an integrated circuit (IC) comprising: a plurality of redundant critical path circuits, wherein at least one of the plurality of redundant critical path circuits meeting a performance requirement is operational and the others are non-operational.

A second aspect of the disclosure provides a design structure embodied in a machine readable medium used in a design process, the design structure comprising: a circuit including a plurality of redundant critical path circuits, wherein at least one of the plurality of redundant critical path circuits meeting a performance requirement is operational and the others are non operational.

A third aspect of the disclosure provides a method comprising: identifying a critical path in an integrated circuit (IC) design structure that presents a challenge to a performance requirement; modifying the IC design structure to have a plurality of redundant circuits of the identified critical path, each circuit constrained to an island in design hierarchy; forming an integrated circuit (IC) having the plurality of redundant circuits of the identified critical path; testing the IC to determine which of the plurality of redundant circuits meet the performance requirement; and activating at least one of the plurality of redundant circuits that meets the performance requirement while leaving at least one other of the plurality of redundant circuits de-activated.

A fourth aspect of the disclosure provides a system comprising: means for identifying a critical path in an integrated circuit (IC) design structure that presents a challenge to a performance requirement; means for modifying the IC design structure to have a plurality of redundant circuits of the identified critical path, each circuit constrained to an island in design hierarchy; means for forming an integrated circuit (IC) having the plurality of redundant circuits of the identified critical path; means for testing the IC to determine which of the plurality of redundant circuits meet the performance requirement; and means for activating at least one of the plurality of redundant circuits that meets the performance requirement while leaving at least one other of the plurality of redundant circuits de-activated.

A fifth aspect of the disclosure provides a program product stored on a computer-readable medium, which when executed, aids in meeting a performance requirement for an IC using redundant critical path circuits, the program product comprising program code configured for: identifying a critical path in an integrated circuit (IC) design structure that presents a challenge to a performance requirement; modifying the IC design structure to have a plurality of redundant circuits of the identified critical path, each circuit constrained to an island in design hierarchy; forming an integrated circuit (IC) having the plurality of redundant circuits of the identified critical path; testing the IC to determine which of the plurality of redundant circuits meet the performance requirement; and activating at least one of the plurality of redundant circuits that meets the performance requirement while leaving at least one other of the plurality of redundant circuits de-activated.

A sixth aspect of the disclosure provides a computer-readable medium that includes computer program code to enable a computer infrastructure to meet a performance requirement using redundant critical path circuits, the computer-readable medium comprising computer program code for performing the method steps of the disclosure.

A seventh aspect of the disclosure provides a business method for meeting a performance requirement using redundant critical path circuits, the business method comprising managing a computer infrastructure that performs each of the steps of the disclosure; and receiving payment based on the managing step.

An eighth aspect of the disclosure provides a method of generating a system for meeting a performance requirement using redundant critical path circuits, the method comprising: obtaining a computer infrastructure; and deploying means for performing each of the steps of the disclosure to the computer infrastructure.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 1A shows one embodiment of an integrated circuit according to the disclosure.

FIG. 1B shows one embodiment of circuit inter-relations within the IC of FIG. 1A according to the disclosure.

FIG. 2 shows a block diagram of a general purpose computer system which may be used to practice the disclosure.

FIG. 3 shows a flow diagram of a design process used in semiconductor design, manufacturing, and/or test.

FIG. 4 shows a block diagram of one embodiment of a design system for implementing part of the design process of FIG. 3.

FIG. 5 shows a flow diagram of one embodiment of the part of the design process.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1A:
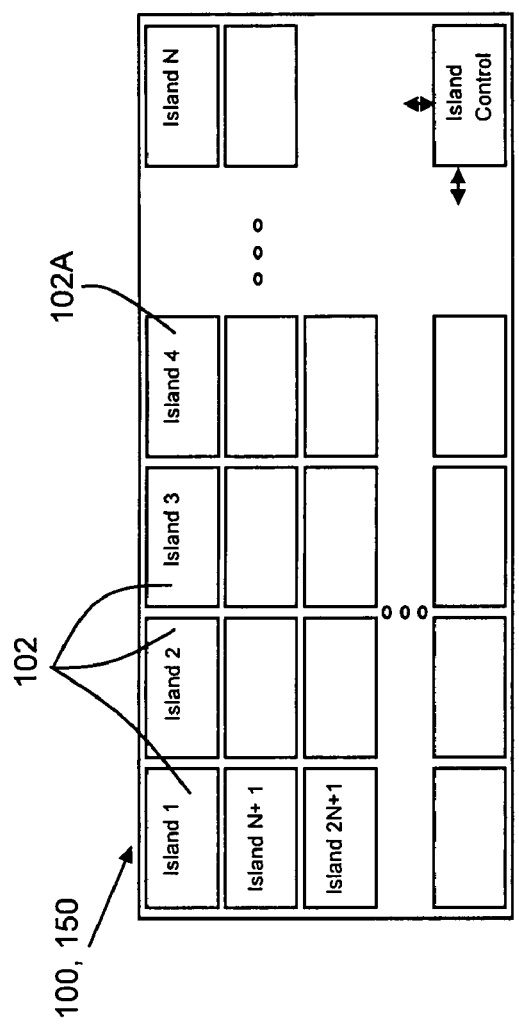

Referring to FIG. 1A, one embodiment of the disclosure relates to an integrated circuit (IC) 100 including a plurality of redundant critical path circuits 102. Circuits 102 are also labeled as "islands" because in a layout 150 form, each circuit 102 is constrained to an island in design hierarchy. The particular redundant critical path circuit 102 that has been copied may be one that has been identified as presenting a challenge to a performance requirement. The performance requirement could be any parameter(s) of IC 100, e.g., timing, power usage, clock speed, active power, leakage power, etc. At least one of the plurality of redundant critical path circuits 102A that meets the performance requirement is operational and the others are non-operational. In this fashion, once IC 100 is formed, testing of IC 100 may reveal which of redundant critical path circuits 102A meets (i.e., meet or exceeds) the performance requirement. In one embodiment, the circuit 102A having the best performance is activated while leaving the other of redundant circuits 102 de-activated. The number of redundant circuits 102 provided may vary, and may be created according to an algorithm based upon, for example, the performance requirement, known process variables, etc.

Figure 1B:
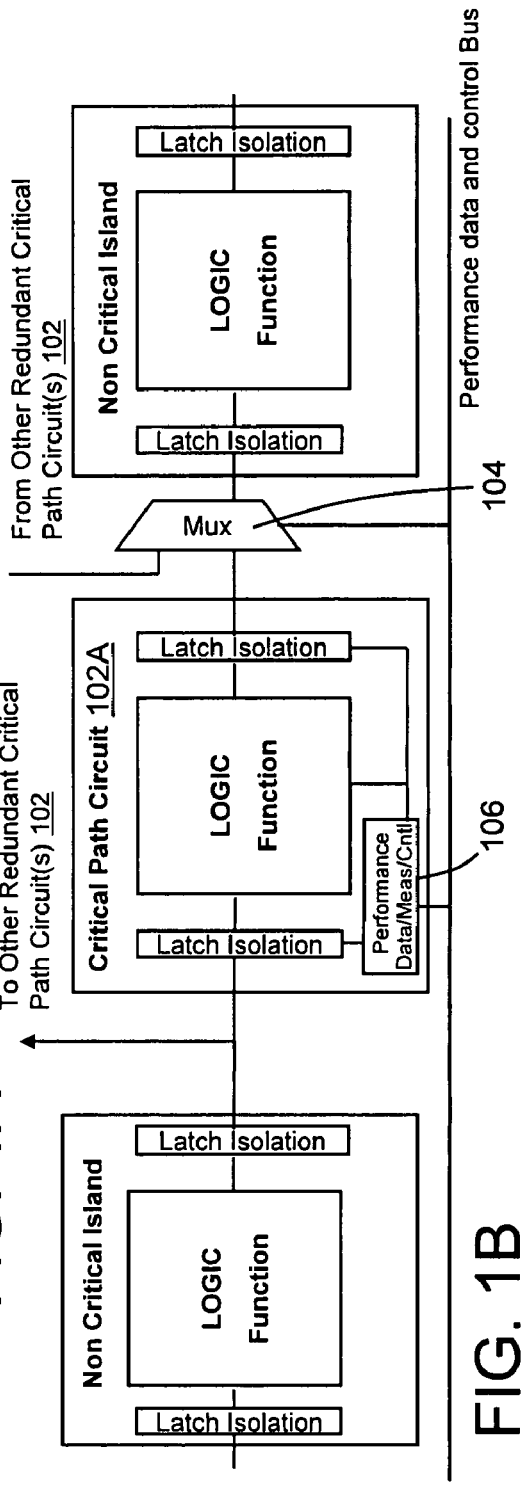

FIG. 1B shows one embodiment of circuit inter-relations within the IC of FIG. 1A according to the disclosure. As shown, a redundant circuit 102A may be switched into or out of the rest of IC 100 using a multiplexer 104.

Figure 2:
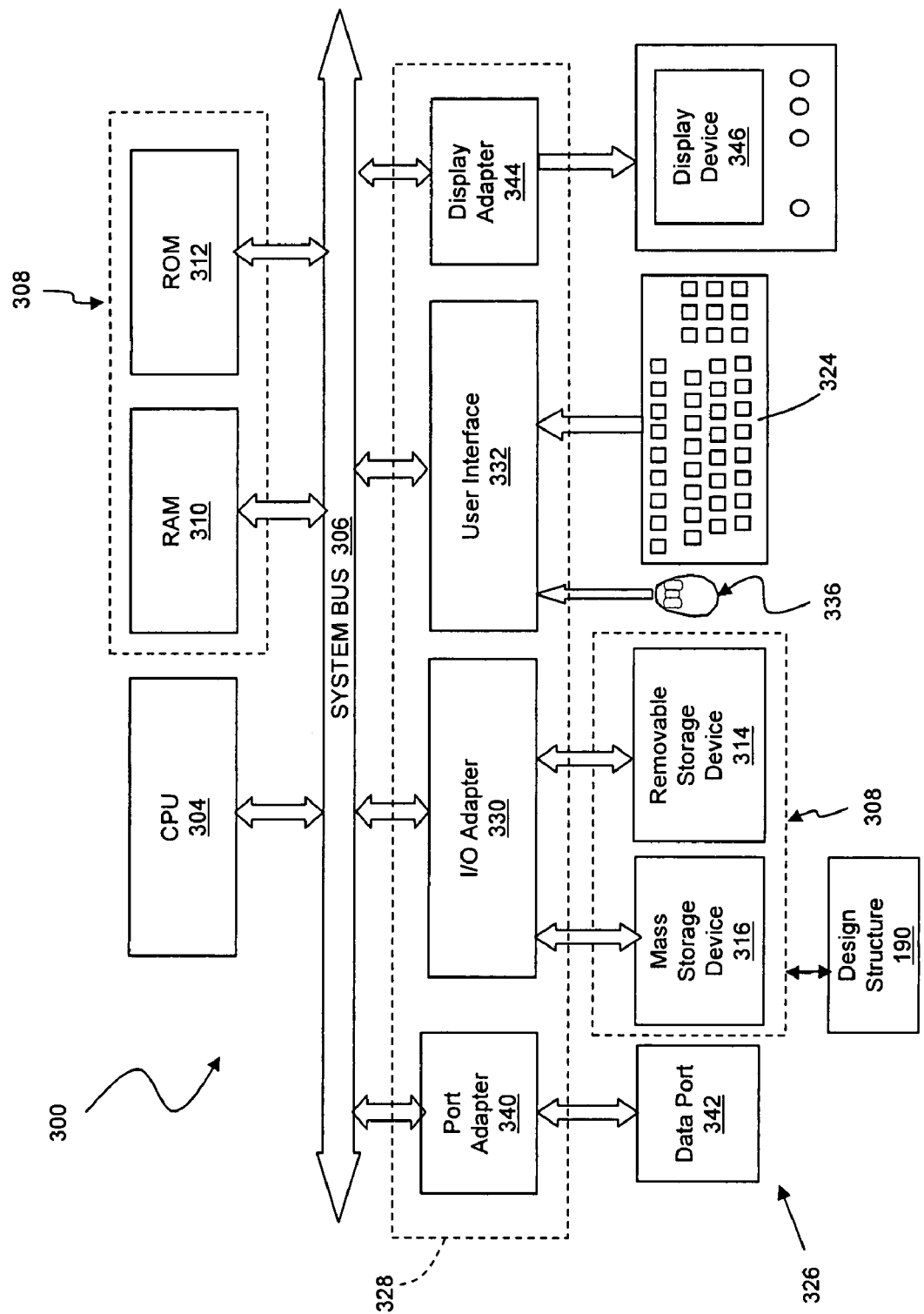

FIG. 2 illustrates a block diagram of a general-purpose computer system which can be used to implement IC 100 (FIG. 1A) and a design structure 190, described herein. IC 100 (FIG. 1A) as described above is part of the design structure for an integrated circuit chip. The chip design is created in a graphical computer programming language, and coded as a set of instructions on machine readable removable or hard media (e.g., residing on a graphical design system (GDS) storage medium). That is, design structure 190 (FIG. 2) is embodied in a machine readable medium 308 used in a design process. (Although design structure 190 is shown interfacing with mass storage device 316 or removable storage device 314, it may interface with any part of machine readable media 308). Design structure 190 includes a plurality of redundant critical path circuits 102, wherein at least one of the plurality of redundant critical path circuits 102A meets a performance requirement is operational and the others 102 are non-operational. Design structure 190 may include a netlist, which describes IC 100 (FIG. 1A), and may include test data files, characterization data, verification data, or design specifications. If the designer does not fabricate chips or the photolithographic masks used to fabricate chips, the designer transmits the resulting design structure 190 by physical means (e.g., by providing a copy of the storage medium storing the design) or electronically (e.g., through the Internet) to such entities, directly or indirectly. The stored design is then converted into the appropriate format (e.g., graphic design system II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

FIG. 2 shows a computer system 300, which has at least one microprocessor or central processing unit (CPU) 304. CPU 304 is interconnected via a system bus 306 to machine readable media 308, which includes, for example, a random access memory (RAM) 310, a read-only memory (ROM) 312, a removable and/or program storage device 314 and a mass data and/or program storage device 316. For the purposes of this description, machine readable media (also referred to as a computer-usable or computer readable medium) can be any apparatus that can contain, store, communicate, propagate, or transport the program for use by or in connection with the instruction execution system, apparatus, or device, i.e., computer system. The medium can be an electronic, magnetic, optical, electromagnetic, infrared, or semiconductor system (or apparatus or device) or a propagation medium. I/O device(s) 326 can comprise any device that enables a user to interact with computer system 300 or any device that enables computer system 300 to communicate with one or more other computing devices. Input/output device(s) 326 can be coupled to system bus 306 either directly or through intervening I/O controllers 328. As illustrated, an input/output (I/O) adapter 330 connects mass storage device 316 and removable storage device 314 to system bus 306; user interface 332 connects a keyboard 334 and a mouse 336 to system bus 306; a port adapter 340 connects a data port 342 to system bus 306; and a display adapter 344 connects a display device 346. ROM 312 contains the basic operating system for computer system 300. Examples of removable data and/or program storage device 314 include magnetic media such as floppy drives, tape drives, portable flash drives, zip drives, and optical media such as CD ROM or DVD drives. Examples of mass data and/or program storage device 316 include hard disk drives and non-volatile memory such as flash memory. In addition to keyboard 334 and mouse 336, other user input devices such as trackballs, writing tablets, pressure pads, microphones, light pens and position-sensing screen displays may be connected to user interface 332. Examples of display device 346 include cathode-ray tubes (CRT) and liquid crystal displays (LCD).

Computer system 300 can comprise any general purpose computing article of manufacture capable of executing computer program code installed by a user (e.g., a personal computer, server, handheld device, etc.). However, it is understood that computer system 300 is only representative of various possible equivalent computing devices that may perform the various processes of the disclosure. To this extent, in other embodiments, computer system 300 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer system 300 is only illustrative of various types of computer infrastructures for implementing the disclosure. For example, in one embodiment, computer system 300 comprises two or more computing devices (e.g., a server cluster) that communicate over any type of interconnected and/or interconnectless communications link, such as a network, a shared memory, or the like, to perform the various process steps of the disclosure. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

A machine readable computer program may be created by one of skill in the art and stored in computer system 300 and/or any one or more of machine readable media 308 to simplify the practicing of this disclosure. In operation, information for the computer program created to run the present disclosure is loaded on the appropriate removable data and/or program storage device 314, fed through data port 342 or entered using keyboard 334. A user controls the program by manipulating functions performed by the computer program and providing other data inputs via any of the above mentioned data input means. Display device 346 provides a means for the user to accurately control the computer program and perform the desired tasks described herein.

Figure 3:
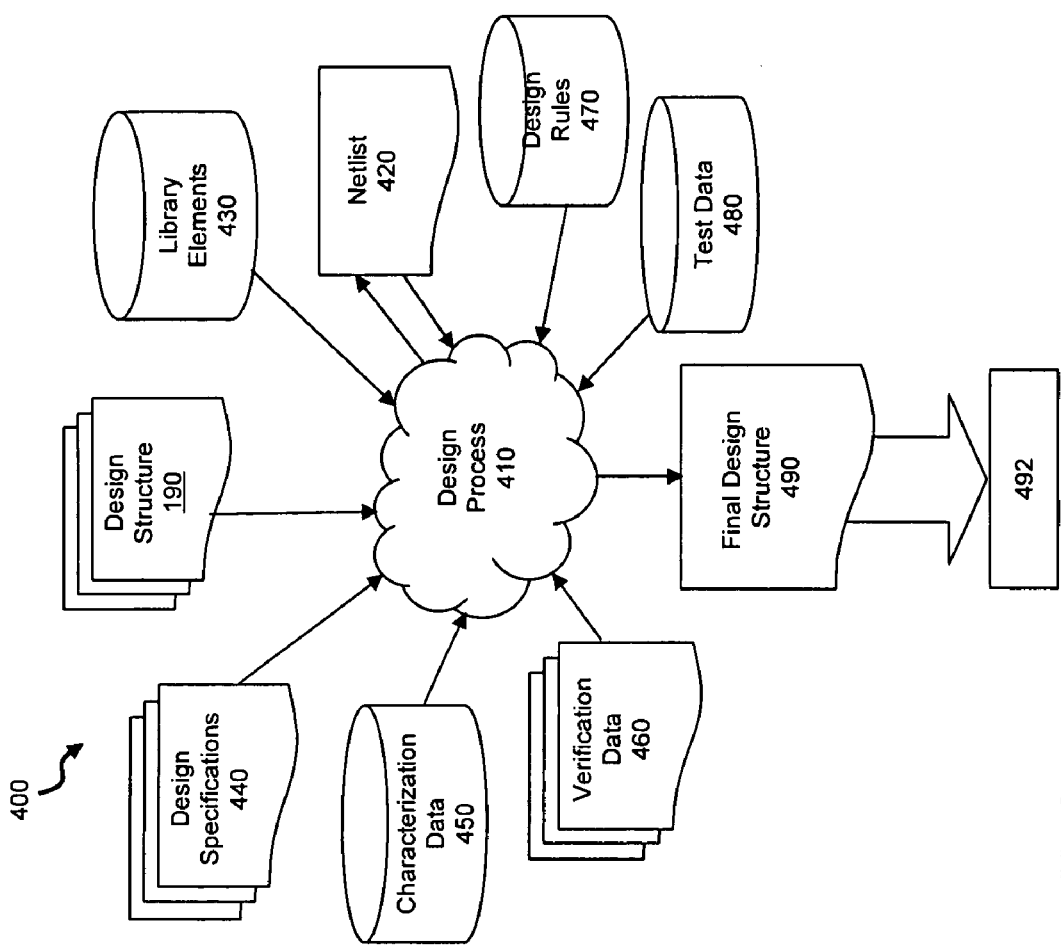

FIG. 3 shows a block diagram of an example design flow 400. Design flow 400 may vary depending on the type of integrated circuit (IC) being designed. For example, a design flow 400 for building an application specific IC (ASIC) will differ from a design flow 400 for designing a standard component. Design structure 190 is an input to a design process 410 and may come from an IP provider, a core developer, or other design company. Design structure 190 comprises IC 100 in the form of schematics or a hardware-description language (HDL) (e.g., Verilog, VHDL, C, etc.). Design structure 190 may be on one or more of machine readable medium 308 as shown in FIG. 2. For example, design structure 190 may be a text file or a graphical representation of IC 100. Design process 410 synthesizes (or translates) IC 100 into a netlist 420, where netlist 420 is, for example, a list of interconnects, transistors, logic gates, control circuits, I/O, models, etc. and describes the connections to other elements and circuits in an integrated circuit design and recorded on at least one of machine readable medium 308.

Design process 410 includes using a variety of inputs; for example, inputs from library elements 430 which may house a set of commonly used elements, circuits, and devices, including models, layouts, and symbolic representations, for a given manufacturing technology (e.g., different technology nodes, 32 nm, 45 nm, 40 nm, etc.), design specifications 440, characterization data 450, verification data 460, design rules 470, and test data files 480, which may include test patterns and other testing information. Design process 410 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 410 without deviating from the scope and spirit of the disclosure.

Ultimately, design process 410 translates IC 100, along with the rest of the integrated circuit design (if applicable), into a final design structure 490 (e.g., information stored in a GDS storage medium). Final design structure 490 may comprise information such as, for example, test data files, design content files, manufacturing data, layout parameters, interconnects, levels of metal, vias, shapes, test data, data for routing through the manufacturing line, and any other data required by a semiconductor manufacturer to produce IC 100. Final design structure 490 may then proceed to a stage 492 of design flow 400, where stage 492 is, for example, where final design structure 490 proceeds to tape-out, is released to manufacturing, is sent to another design house or is sent back to the customer.

Figure 4:
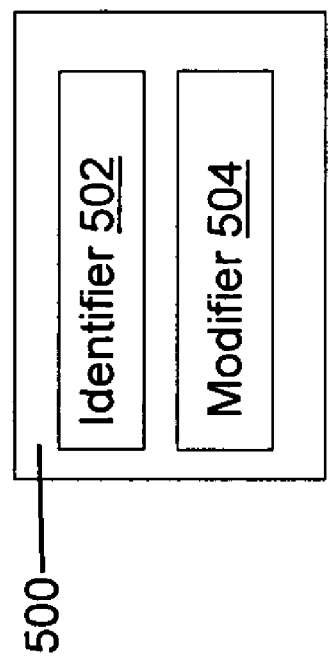

Turning to FIG. 4, a block diagram of one embodiment of a design system 500 for implementing a part of design process 410 (FIG. 3) according to the disclosure is illustrated. Design system 500 is stored on machine readable medium 308 (FIG. 2). Design system 500 includes an identifier 502 and a modifier 504, the functions of which will be described further herein.

Figure 5:
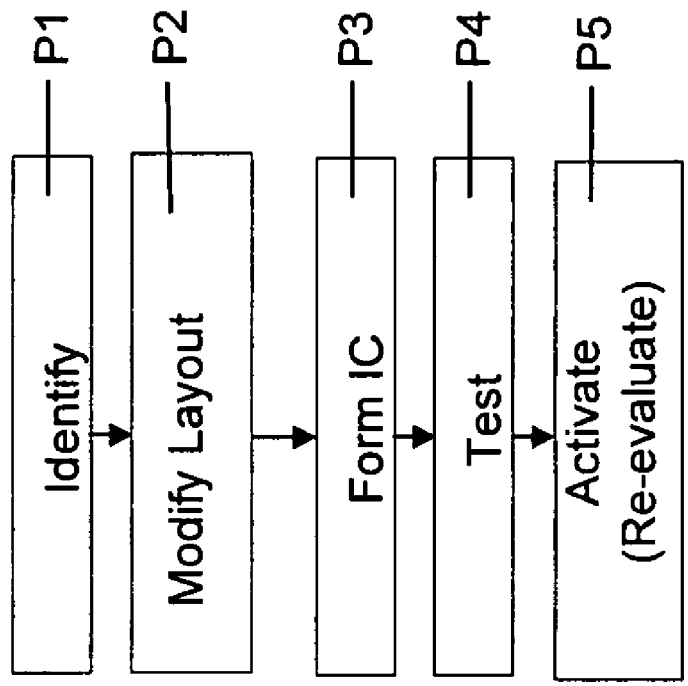

Turning to FIG. 5, a flow diagram illustrating one embodiment of part of design process 410 for meeting a performance requirement of an IC using redundant critical path circuits is illustrated. In process P1, identifier 502 identifies a critical path in an integrated circuit (IC) design structure 190 that presents a challenge to a performance requirement. As noted above, the performance requirement may be any parameter(s) of IC 100, e.g., timing, power usage, clock speed, active power, leakage power, etc. In process P2, modifier 504 modifies IC design structure 190 to have a plurality of redundant circuits 102 (FIG. 1A) of the identified critical path, each circuit constrained to an island in design hierarchy. In process P3, IC 100 is formed having plurality of redundant circuits 102 of the identified critical path. This process may include any now known or later developed techniques and equipment for forming an IC, e.g., photolithography equipment, etching process chambers, deposition chambers, testing equipment, etc. In process P4, IC 100 is tested to determine which of the plurality of redundant circuits 102 meets the performance requirement. This process may include using any now known or later developed testing techniques and equipment, and may be carried out in a number ways. For example, each circuit 102 may include a built-in-self-test (BIST) such that direct testing can occur, or indirect ring oscillator (PSRO) may be used. The results of testing can be stored for various temperatures and voltage levels. FIG. 1B shows an illustrative performance data/measurement/control 106, e.g., a BIST with storage. In one embodiment, process P4 occurs at manufacturing test and the results are stored in electronic fuse (e-fuse) or flash memory. Process P4 may occur at power-up or system start. As understood by those with skill in the art, any performance parameter may be tested in this manner. In process P5, at least one of the plurality of redundant circuits 102A that meets the performance requirement is activated while leaving at least one other of the plurality of redundant circuits 102 de-activated. In one embodiment, redundant circuit(s) 102A exhibits the best performance, e.g., optimal timing. However, the selection of redundant circuit(s) 102A that is activated may vary on a number of different issues. This process may be controlled via multiplexer 104 (FIG. 1), electronic fuses within IC 100 or other now known or later developed mechanisms of activating/deactivating parts of an IC. Process P5 may also include re-evaluation and re-configuring of IC 100 based on a change in circumstances, e.g., a voltage change, temperature change, etc. Processes P4-P5 may be controlled by an algorithm that controls testing, polling of redundant circuits 102 and decisionmaking as to which redundant circuit(s) 102 is activated. The algorithm may be implemented via hardware (flip-flop machine) and/or software.

Layout 150 (FIG. 1A) is output as part of final design structure 490 (FIG. 3) such that final design structure 490 includes IC 100. As noted above, final design structure 490 may comprise a netlist, which describes IC 100 (layout 150), and may reside on a graphical design system (GDS) storage medium 308 (FIG. 2). Further, final design structure 490 may include, as shown in FIG. 3, test data files 480, characterization data 450, verification data 460 or design specifications 440.

The methods, system, program product, design structure and design flow as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

As discussed herein, various systems may be described as "obtaining" data. It is understood that the corresponding data can be obtained using any solution. For example, the corresponding system/component can generate and/or be used to generate the data, retrieve the data from one or more data stores (e.g., a database), receive the data from another system/component, and/or the like. When the data is not generated by the particular system/component, it is understood that another system/component can be implemented apart from the system/component shown, which generates the data and provides it to the system/component and/or stores the data for access by the system/component.

The disclosure can take the form of an entirely hardware embodiment, an entirely software embodiment or an embodiment containing both hardware and software elements. In a preferred embodiment, the disclosure is implemented in software, which includes but is not limited to firmware, resident software, microcode, etc. In one embodiment, the disclosure can take the form of a computer program product accessible from a computer-usable, computer-readable medium or machine readable medium providing program code for use by or in connection with a computer system or any instruction execution system, which when executed, enables a computer system to perform the processes described herein.

In another embodiment, the disclosure provides a method of generating a system for performing the processes described herein. In this case, a computer system 300, can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computer system 300, from a machine readable medium; (2) adding one or more computing devices to the computer infrastructure; and (3) incorporating and/or modifying one or more existing systems of the computer infrastructure, to enable the computer infrastructure to perform the process steps of the disclosure.

In still another embodiment, the disclosure provides a business method that performs the process described herein on a subscription, advertising, and/or fee basis. That is, a service provider, such as an application service provider (ASP), could offer to perform the processes as described herein. In this case, the service provider can manage (e.g., create, maintain, support, etc.) a computer infrastructure, such as computer system 300, that performs the process described herein for one or more customers. In return, the service provider can receive payment from the customer(s) under a subscription and/or fee agreement, receive payment from the sale of advertising to one or more third parties, and/or the like.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. An integrated circuit (IC) comprising:
    a plurality of redundant critical path circuits, wherein a critical path circuit is identified as a circuit that presents a challenge to a performance requirement and the critical path circuit is copied to produce the plurality of redundant critical path circuits,
    wherein one redundant critical path circuit of the plurality of redundant critical path circuits that meets the performance requirement and has a best performance is operational and the others of the plurality of redundant critical path circuits that do not meet the performance requirement or do not have the best performance are non-operational and are switched out of a remaining portion of the IC using a multiplexer, wherein the performance requirement includes at least one of: a timing requirement, a power usage requirement, a clock speed requirement, an active power requirement, or a power leakage requirement, and wherein the IC is evaluated based on a change in circumstances, the change in circumstances including a voltage or temperature change, to determine which of the plurality of redundant critical path circuits meets the performance requirement and has the best performance.

2. A design structure in a data format embodied in a machine readable medium used in a design process, the design structure comprising:
    a circuit including a plurality of redundant critical path circuits, wherein a critical path circuit is identified as a circuit that presents a challenge to a performance requirement and the critical path circuit is copied to produce the plurality of redundant critical path circuits,
    wherein one redundant critical path circuit of the plurality of redundant critical path circuits that meets the performance requirement and has a best performance is operational and the others of the plurality of redundant critical path circuits that do not meet the performance requirement or do not have the best performance are non-operational and are switched out of a remaining portion of the IC using a multiplexer, wherein the performance requirement includes at least one of: a timing requirement, a power usage requirement, a clock speed requirement, an active power requirement, or a power leakage requirement, and wherein the circuit is evaluated based on a change in circumstances, the change in circumstances including a voltage or temperature change, to determine which of the plurality of redundant critical path circuits meets the performance requirement and has the best performance.

3. The design structure of claim 2, wherein the design structure comprises a netlist, which describes the circuit.

4. The design structure of claim 2, wherein the design structure resides on a graphical design system (GDS) storage medium.

5. The design structure of claim 2, wherein the design structure includes test data files, characterization data, verification data, or design specifications.

6. A method comprising:
- identifying, using a computer, a critical path in an integrated circuit (IC) design that presents a challenge to a performance requirement, wherein the performance requirement includes at least one of: a timing requirement, a power usage requirement, a clock speed requirement, an active power requirement, or a power leakage requirement;
- modifying the IC design by copying the identified critical path to produce a plurality of redundant circuits of the identified critical path;
- forming an integrated circuit (IC) having the plurality of redundant circuits of the identified critical path;
- testing the IC to determine which of the plurality of redundant circuits meet the performance requirement;
- activating one redundant circuit of the plurality of redundant circuits that meets the performance requirement and has a best performance while de-activating the others of the plurality of redundant circuits that do not meet the performance requirement or do not have the best performance and switching out the others of the plurality of redundant circuits from a remaining portion of the IC using a multiplexer; and
- re-testing the IC based on a change in circumstances, the change in circumstances including a voltage or temperature change, to determine which of the plurality of redundant circuits meets the performance requirement and has the best performance.

7. A system comprising:
- means for identifying a critical path in an integrated circuit (IC) design that presents a challenge to a performance requirement, wherein the performance requirement includes at least one of: a timing requirement, a power usage requirement, a clock speed requirement, an active power requirement, or a power leakage requirement;
- means for modifying the IC design by copying the identified critical path to produce a plurality of redundant circuits of the identified critical path;
- means for forming an integrated circuit (IC) having the plurality of redundant circuits of the identified critical path;
- means for testing the IC to determine which of the plurality of redundant circuits meet the performance requirement;
- means for activating one redundant circuit of the plurality of redundant circuits that meets the performance requirement and has a best performance while de-activating the others of the plurality of redundant circuits that do not meet the performance requirement or do not have the best performance and switching out the others of the plurality of redundant circuits from a remaining portion of the IC using a multiplexer; and
- means for re-testing the IC based on a change in circumstances, the change in circumstances including a voltage or temperature change, to determine which of the plurality of redundant circuits meets the performance requirement and has the best performance.

* * * * *